United States Patent [19]

Alfaro et al.

[11] Patent Number: 5,646,865

[45] Date of Patent: Jul. 8, 1997

[54] AUTOMOTIVE DIAGNOSTIC COMMUNICATIONS

[75] Inventors: Enrique Jose Alfaro, West Bloomfield; Jean Marie Meister-Westermann, Wixon; John Joseph Cicala, Livonia, all of Mich.

[73] Assignee: General Motors Corporation, Detroit, Mich.

[21] Appl. No.: 330,124

[22] Filed: Oct. 27, 1994

[51] Int. Cl.[6] .................... G01M 17/00; G01M 15/00; G05B 19/00
[52] U.S. Cl. ................... 364/514 R; 364/424.034
[58] Field of Search ............ 364/424.01, 424.03, 364/431.04, 431.12, 940.8, 942.06, 431.11, 222.2, 238, 238.2, 240.8, 514 R; 395/831, 285; 73/116, 117.2, 118.1; 324/402

[56] References Cited

U.S. PATENT DOCUMENTS

| | | | |
|---|---|---|---|
| 4,694,408 | 9/1987 | Zaleski | 364/551 |
| 4,831,560 | 5/1989 | Zaleski | 364/551.01 |
| 4,853,850 | 8/1989 | Krass, Jr. et al. | 364/200 |
| 4,862,371 | 8/1989 | Maekawa | 364/431.11 |
| 5,214,582 | 5/1993 | Gray | 364/424.03 |
| 5,349,649 | 9/1994 | Iijima | 395/275 |
| 5,459,660 | 10/1995 | Berra | 364/424.03 |
| 5,506,772 | 4/1996 | Kubozono et al. | 364/424.03 |
| 5,523,948 | 6/1996 | Adrain | 64/431.01 |
| 5,541,840 | 7/1996 | Gurne et al. | 364/424.03 |

Primary Examiner—Emanuel T. Voeltz
Assistant Examiner—Tony M. Cole
Attorney, Agent, or Firm—Michael J. Bridges

[57] ABSTRACT

Automotive vehicle electronic devices are diagnosed through communication with a flexible diagnostic tool which automatically switches between a wide variety of communications protocols as required for diagnostic communication tasks presented to the tool. Simultaneous communication with a plurality of devices under a plurality of communications protocols is supported by the tool wherein communication hardware is available for parallel communications under the various protocols via various communication channels and is apportioned for each active diagnostic communication task for the duration of that task.

12 Claims, 3 Drawing Sheets

5,646,865

AUTOMOTIVE DIAGNOSTIC COMMUNICATIONS

FIELD OF THE INVENTION

This invention relates to automotive vehicle diagnostics and, more particularly, to simultaneous diagnostic communications with a plurality of automotive electronic devices.

BACKGROUND OF THE INVENTION

Diagnostic tools are available for monitoring and detecting fault conditions in electronic devices on-board automotive vehicles. The tools communicate with the vehicle electronic devices under communication protocols dictated by the devices. Such communication protocols may vary significantly over the range of vehicle makes, models, model years, and manufacturers. Furthermore, such communication protocols may vary between various electronic devices on-board an individual vehicle.

Conventional diagnostic tools have limited communication flexibility, wherein a tool may only be capable of communicating with a very limited number of vehicles or vehicle electronic devices. Multiple diagnostic tools or manually-reconfigurable tools may be required when a number of diverse vehicles or devices are to be diagnosed. Diagnostic test time and expense increase significantly when more than one tool is required or when a tool operator must manually reconfigure a tool for communication with various devices. Further, manual reconfiguration may be prone to error.

Absent intervention by the diagnostic tool operator, conventional diagnostic tools are typically incapable of interacting with more than one electronic device on-board a test vehicle at a time. Only after a diagnostic test on one device is complete may another be carried out under such conventional diagnostic tools. This can significantly increase the time required to diagnose an entire vehicle, and especially a vehicle having a number of electronic devices to be tested and a diversity of communication protocols. A diagnostic test may be more thorough or more accurate if communication with more than one device or under more than one communication protocol is provided during the test. Conventional diagnostic tools may not be capable of such communications and thus the effectiveness of conventional testing may be limited.

Accordingly, it would be desirable to provide a single diagnostic tool that may be used for diagnostic testing over a range of vehicles or vehicle electronic devices in which a variety of communication protocols may be required without manual tool reconfiguration or tool substitution. It would further be desirable to support diagnostic testing of devices or systems in an automotive vehicle which requires communication under more than one protocol during a single test.

SUMMARY OF THE INVENTION

The present invention is directed to a desirable diagnostic tool providing flexible diagnostic communications with a broad range of automotive vehicles and automotive electronic devices.

More specifically, the diagnostic tool of the present invention includes communications hardware for bi-directional or for uni-directional diagnostic communications under communications protocols used by a wide range of vehicle makes, models, model years, and manufacturers. Minimal manual intervention is required to configure the tool to communicate with various vehicles. Upon interfacing the tool of the present invention with an automotive vehicle having a plurality of electronic devices to be diagnosed, each device supporting diagnostic communications over a dedicated serial communication channel or link, the vehicle is electronically identified and the diagnostic communication channels corresponding to that vehicle automatically referenced. When diagnostic information is requested from any of the devices of the vehicle, the diagnostic tool automatically determines whether communications hardware is available for communication with that device and, if so, reserves the hardware for use in servicing the request. Communications are then encoded and passed to the device and the response received and decoded without operator intervention. Such communication may continue with that device until the test is complete, at which time the communication hardware is released for use in other communication tasks.

In accord with a further aspect of this invention, if a request for diagnostic information requires communication with more than one vehicle electronic device over more than one channel and perhaps under more than one communication protocol, the necessary hardware to carry out the communications over the multiple links is established and reserved for use in servicing the request. Individual channels are then activated on a channel by channel basis as necessary to encode and transmit and to receive and decode communications for each individual link. The communication hardware is unavailable for other low priority tasks while it is reserved. When the request is fully serviced, the reserved hardware is released for use in other communications applications.

In this manner, diagnostic communications with more than one device on an automotive vehicle may be carried out during a single test, reducing test time and potentially increasing test thoroughness and accuracy. A wide range of diagnostic communications protocols may be supported with a single tool, reducing vehicle diagnostic cost. Re-configuration for varying communication protocols over individual vehicles or over a wide range of vehicles is automated, significantly reducing operator intervention.

BRIEF DESCRIPTION OF THE DRAWINGS

The invention may be best understood by reference to the preferred embodiment and to the drawings in which.

DESCRIPTION OF THE PREFERRED EMBODIMENT

Figure 1:
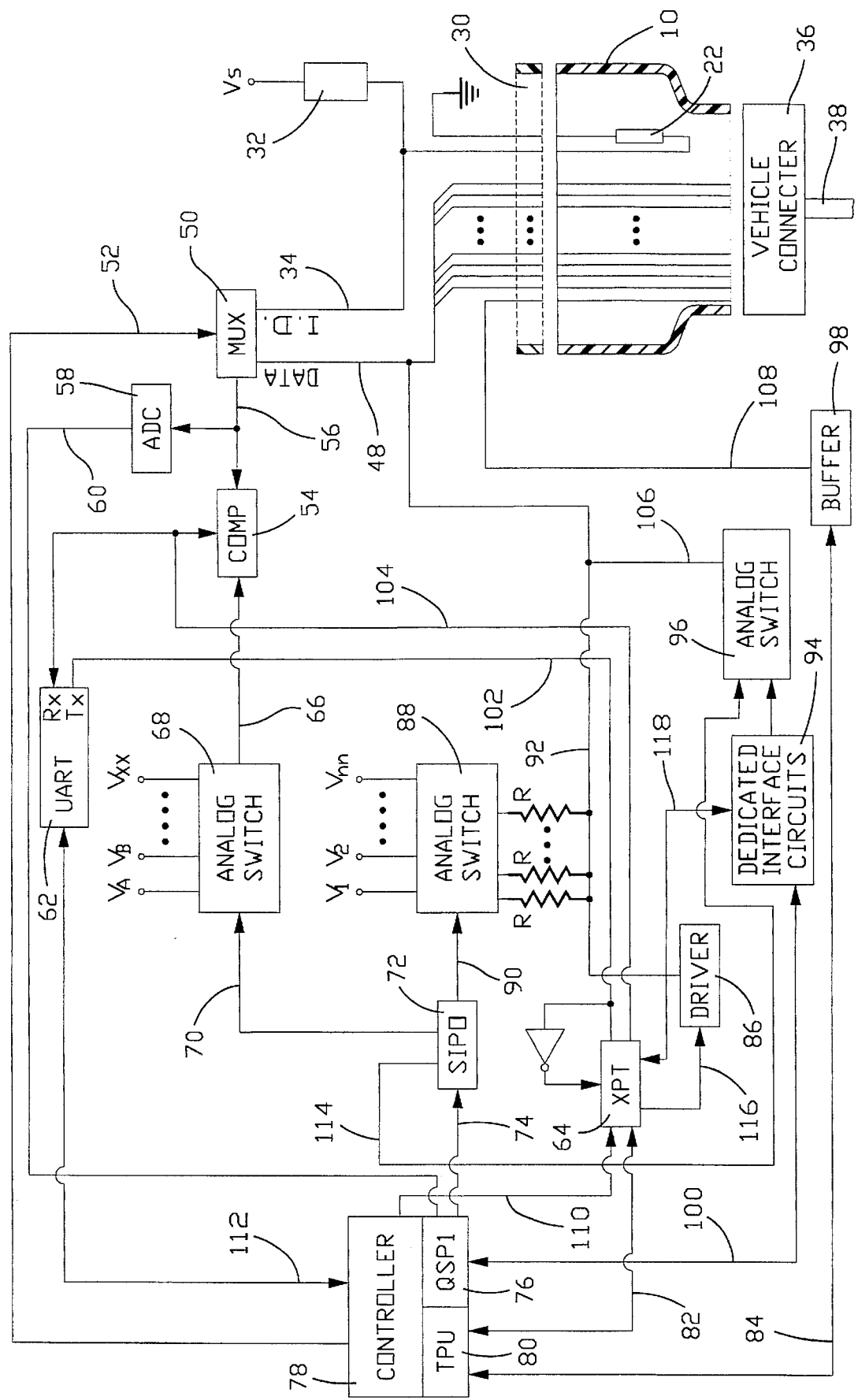
FIG. 1 is a general diagram of the diagnostic communications hardware for automatically establishing simultaneous diagnostic communications between a diagnostic tool and a plurality of automotive vehicle electronic devices in accord with this invention.

Referring to FIG. 1, diagnostic communications circuitry is schematically illustrated and is exercised through operations of controller 78, part no. MC68332, to provide for diagnostic communications between a diagnostic tool and electronic devices on-board an automotive vehicle. Specific part numbers described in this embodiment for electronic circuit components are provided only as examples of components that may be used to carry out specific circuit operations. It should be understood that various substitutions may be made for such specific components through the exercise of ordinary skill in the art. Such electronic devices as vehicle controllers, controllers dedicated to specific control tasks, such as transmission control, engine control, chassis control, climate control, braking control, or other controlled vehicle functions, and general conventional control hardware may carry out diagnostic communications with the external device via the communications circuitry of FIG. 1.

Vehicle diagnostic link 38 includes a series of serial communications links corresponding to a series of electronic devices on-board the vehicle supporting serial communications with the devices. For example, each of the electronic devices may have a dedicated serial communication link included in the diagnostic link 38 for bidirectional communication between the device and an external device, such as an external diagnostic tool. For analysis of electronic device operation, or for diagnosis of electronic device faults, the external device may prompt the electronic device to output information on the current value of device operating parameters, device flag or counter values, or other information from which the state of operating health of the electronic device may be diagnosed by the external device. The diagnostic link 38 terminates at vehicle connector 36 which interfaces with an adapter 10, wherein the adapter is manually selected to provide for connection between vehicle connector 36, which may be particular to the vehicle being diagnosed, and a connector portion 30 of the external device which, in the present embodiment, is a diagnostic tool having communication interface circuitry as schematically diagrammed in FIG. 1.

Adapter 10 includes electrical element 22, for example which may have an electrical resistance particular to the adapter in which it is disposed for vehicle or device identification. Upon connecting the adapter 10 to the connector 30, the voltage drop across element 22 is available as input signal ID to a pre-established input pin of a predetermined one of a series of conventional multiplexers represented generally by MUX 50, part no. DG406DN. To identify the resistance value of the element 22 and thus to identify the adapter type and the corresponding vehicle to which the adapter is interfaced, the voltage input ID to MUX 50 is passed thorough to MUX output line 56 which is provided as an input to conventional analog to digital converter ADC 58, such as part no. ADC10732. The ADC output is provided to a controller 112 as a digital equivalent of the voltage drop across the element 22. The controller may reference vehicle identification information from a stored schedule of voltage drop values paired with information on corresponding vehicle type.

Controller 78 communicates a select signal via control line 52 to each of a series of conventional multiplexers represented by MUX 50. The select signals configure each MUX to pass one active input channel through to the MUX output line, represented by signal line 56. Conventional 10-bit analog-to-digital converter ADC 58, part no. ADC10732, monitors the output line 56 and provides a digital equivalent of the analog signal thereon to controller 78 via signal line 60. Upon initial vehicle connector interface to the diagnostic hardware of FIG. 1, controller 78 issues a select signal on line 52 directing the at least one multiplexer, represented by MUX 50, to pass through the ID input on line 34 to the MUX output line 56. The controller then reads the voltage signal on line 56 via ADC 58 and references from controller non-volatile memory (not shown) information on the device corresponding to such voltage on line 56. Controller 78 then may set up diagnostic communications by directing each of the number of multiplexers 50 to pass through a unique vehicle serial communications input signal from the vehicle communications link 38. In this manner, the diagnostic hardware of FIG. 1 may be efficiently reconfigured for varying vehicle serial communication mechanizations, wherein different connector portion 30 pins may receive diagnostic communications from various vehicle electronic devices. A single adapter interface, such as connector portion 30 may be used and, beyond inserting the proper adapter 10 between the vehicle connector 36 and the diagnostic tool connector portion 30, no operator interaction is required for reconfiguration between different vehicle makes, models, model years, or vehicle manufacturers.

The output signal, such as the signal on line 56, from each of the multiple multiplexers, such as MUX 50, is provided to a corresponding comparator 54, part no. LM393, for discerning binary signal information and for passing such information through to further hardware stages and ultimately to the controller 78. To accommodate varying voltage thresholds of the communication information that may be incoming from various serial communication channels, so as to accommodate various communication protocols, the comparators, such as COMP 54, have varying voltage thresholds above and below which the voltage level of incoming serial data is recognized as respectively, high and low binary information. The thresholds are selectable by controller 78 with benefit of the identification information from the analog to digital converter ADC 58. For example, the controller 78 dictates the data line from the set of data lines 48 to pass through a corresponding one of the set of multiplexers, such as MUX 50. The controller 78 likewise has information pertaining to the voltage threshold of the serial information passed through the multiplexers, and may select a threshold matching the desired voltage threshold by communicating serially such information via its serial output line 74 to conventional SIPO 72 or the conventional output driver device which sets up the threshold via its output select line 70. The select line 70 is provided as an input select line to an analog switch 68, part no. DG445, having selectable voltage inputs VA, VB, . . . VXX. One or more analog switches may be used for passing an appropriate threshold voltage through to each of the comparators, such as COMP 54. Conventional digital to analog converters may be used instead of the analog switches represented by switch 68 for selection of voltage reference values. The voltage signal VA applied to analog switch 68 may correspond to a TTL threshold voltage, VB may correspond to an RS 232 communications threshold, etc. Any expected serial communications threshold may be included in the selectable range of the analog switch or switches 68. Accordingly, the input signal comparators, such as COMP 54 may be used to receive and decode binary information from a variety of sources. Comparator output signal on line 104 may be provided to the receive pin of a conventional UART 62, part no. 16C2550, for decoding and forwarding to controller 78 via line 112. Further, UART output line 102 may be provided to a conventional 16×8×1 cross point switch XPT 64, part no. CD22M3494, such as controlled by controller 78 via control line 110 to distribute various diagnostic input and output information through the stages of the hardware of FIG. 1. For example, the XPT 64 communicates bi-directionally with a Time Processing Unit TPU 80 of controller 78, for input signal timing measurement and generation of time-based output signals. Such TPU functions are generally known and practiced in the art. The XPT 64 may provide input signal information to the TPU 80 for analysis of signal duration or frequency, or the TPU 80 may be used for UART emulation with TPU output information easily accessed by controller 78, and the TPU 80 may output pulsetrain information, timed individual pulses, or serial communications data to the XPT 64, and the controller 78 may direct the XPT to pass such information on, via output stages of the diagnostic hardware of FIG. 1, ultimately to vehicle electronic devices, so as to carry out conventional device diagnostics. The XPT 64 acts as a switching device for controller or TPU communications to various stages of the hardware of FIG. 1. UART transmit output signal on line 102 is provided in both inverted and non-inverted form directly to XPT 64, so as to be passed on to driver 86 or dedicated interface circuits 94. Two-way serial communications are provided on a plurality of communication links, such as represented by link 118 between XPT 64 and dedicated interface circuits 94, for protocol handling of a variety of communications protocols including CCD serial communications, SAE J1850 communications, SAE J1708 communications, and other protocols generally available for vehicle serial communications. The configuration of each of such interface circuits may be as described in generally available S.A.E. or manufacturer specifications.

Incoming data may be received by the XPT 64 via line 104 and forwarded, as dictated by control information on line 110 from controller 78, to the appropriate one of the dedicated interface circuits 94 required for decoding of such serial information. The decoded diagnostic information may be provided directly to controller 78 via a queued serial peripheral interface circuit 76 via line 100, or may be provided to UART 62 for further decoding, or may be passed through XPT 64 to TPU 80 for analysis.

Output signal information from controller 78 may be issued directly to the appropriate vehicle electronic device via buffered serial communication line 84 connected to signal buffer 98 and output to connector portion 30 via line 108. Alternatively, output data may pass from TPU 80 of controller 78 to cross point switch XPT 64 for communication to the dedicated interface circuits 94, or may be provided directly to interface circuits 94 through queued serial communications from QSPI 76 of controller 78. After implementing the appropriate communications protocol, the interface circuits 94 provide the diagnostic output information to analog switch 96, part no. DG445, which operates under control of controller 78 via output lines 114 of SIPO 72, for directing output signal information to an appropriate output signal line so that it passes to the appropriate electronic device on the vehicle. The output lines of analog switch are generally illustrated as line 106.

Alternatively, for communications protocols requiring specialized voltage pull-up values, the interface circuit 94 output may be provided to XPT 64, which may be directed by controller 78 to pass the interface circuit output to a series of line drivers 86, part nos. BUK583, via a plurality of lines illustrated generally as line 116. The output of the series of drivers 86 is passed to connector portion 30 for output to the appropriate electronic device on the vehicle. The output illustrated as line 116 may include a plurality of individual output lines, each of which may be pulled up to an appropriate voltage level, such as a five volt level, a twelve volt level, or other conventional voltage level as may be required for operation of the corresponding conventional automotive electronic device. A series of voltage inputs are provided to analog switch 88, part no. DG445, including V1, V2, . . . , Vn, each of which has a predetermined voltage level such as may be provided by dedicated power supplies (not shown) or generated through conventional voltage divider circuitry. A select line 90 from SIPO 72 operating under control of controller 78 directs a voltage pull-up from the set V1, V2, . . . , Vn to be applied to each of the output lines 92 in accord with the identification information received from adapter 10 and any other identification received by controller 78, such as from ADC 58, on the voltage levels required for communication with the various devices currently being tested. Pull-up resistors R are provided between each of the selectable voltage levels input to analog switch 88 and the output lines 92, wherein a single resistor value R may be used by all lines, or the resistance value may vary from line to line.

Figure 2:
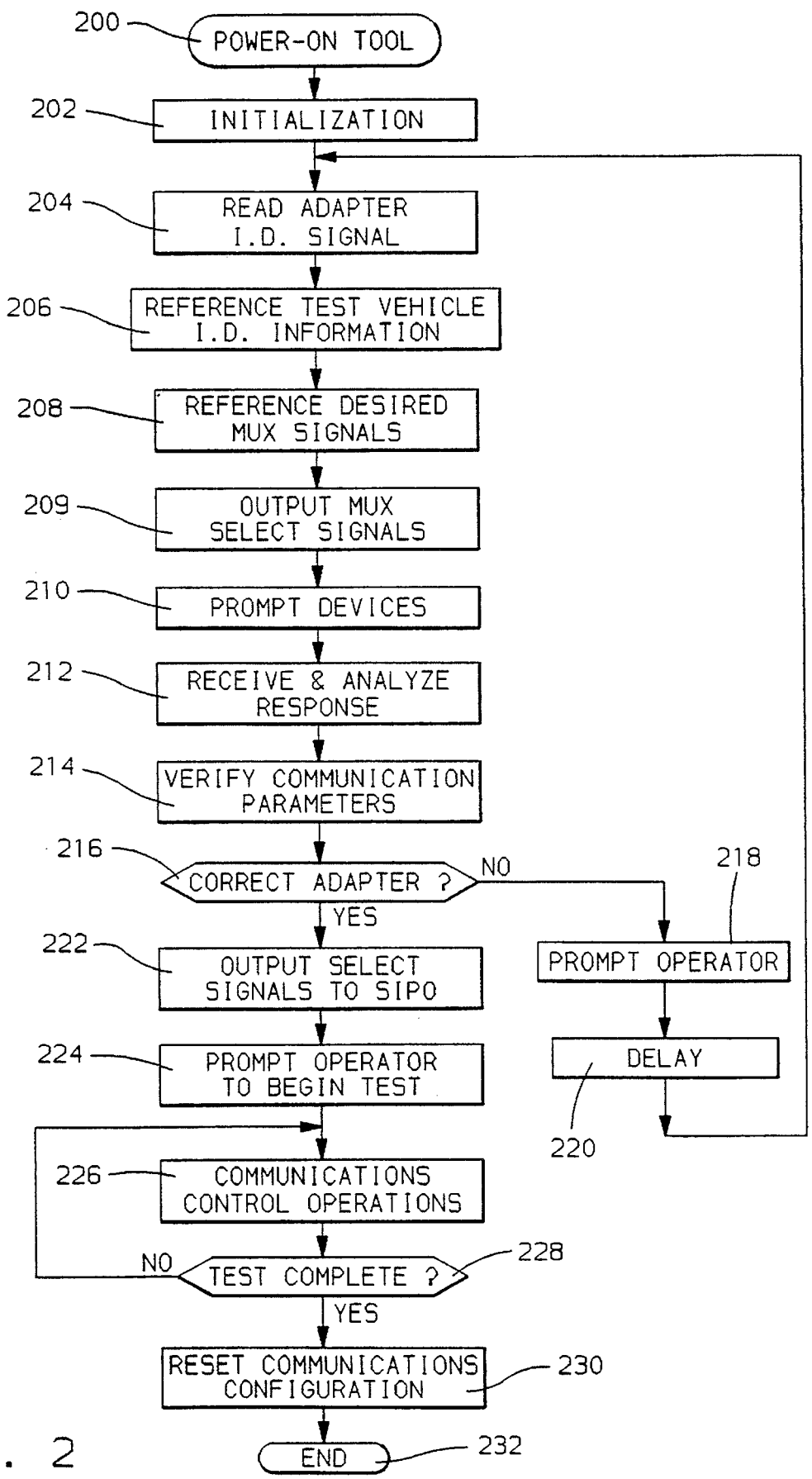
FIGS. 2 and 3 illustrate a flow of controller operations for exercising the diagnostic communications hardware of FIG. 1.

FIG. 2 illustrates a flow of controller 78 operations for vehicle and electronic device identification and for setting up and carrying out diagnostic communications in accord with this invention. The flow of operations are provided for general illustration of a startup of controller at the beginning of a diagnostic test, at which it attempts to identify the vehicle under test and to establish a communication setup compatible with the communications link of that vehicle. Referring to FIG. 2, when power is applied to the diagnostic tool having hardware illustrated schematically in FIG. 1, such as when a vehicle operator turns the tool on after connecting the tool to at least one automotive vehicle electronic device through a vehicle connector using the adapter 10 of FIG. 1 suited to the vehicle connector, the controller operations generally begin at a step 200 and proceed to a step 202 to carry out initialization operations, such as may include conventional power-on self-test functions, memory clearing operations, reset operations for pointers, flags and counters, and other generally-understood start-up operations. The routine then reads the adapter ID signal at a step 204, such as by selecting the ID signal line 34 of FIG. 1 to pass through MUX 50 to MUX output line 56 and then by reading the ADC output signal on line 60 indicating the value of the electrical element 22 of FIG. 1. After reading the ID signal, test vehicle identification information is referenced at a step 206, wherein such information may include vehicle make, model year, model and other identification information. This identification information may be referenced by selecting the vehicle identification information from a conventional lookup table in controller non-volatile memory that is stored corresponding to the value of the ID signal read at the step 204.

Next, desired MUX signals are referenced from controller non-volatile memory as the MUX configurations corresponding to the identified vehicle. For example, if the identified vehicle has three serial data lines for diagnostic communications with a respective three vehicle electronic devices, and the three lines are connected to pins 2, 4, and 6 of connector portion 30, then the referenced desired MUX signals may indicate that a first MUX, such as MUX 50 of FIG. 1, should pass through information on pin 2 to its output line 56, the second MUX should pass through information on pin 4 to its output line, and the third MUX should pass through information on pin 6 to its output line. In this manner, any active serial data lines carrying diagnostic communications may be passed through to a corresponding MUX for analysis by a corresponding comparator, such as COMP 54 of FIG. 1, so that such diagnostic communications may be made available to controller 78.

After referencing the desired MUX signals, select signals are output to each MUX that is to be activated at a step 209 to configure each active MUX to pass through a corresponding serial data channel. The vehicle electronic devices are next prompted at a step 210 to trigger device response communications, which may be used for verification of communication parameters, such as pull-up and threshold voltage values and communication frequencies. Device responses to the prompt of step 210 are next received and analyzed at a step 212 which may require a delay to wait for such responses to be received. The received signals are analyzed for identification of communication parameters such as pull-up and threshold voltage values and communication frequency values. Such parameters may be used by controller 78 of FIG. 1 for communications control with such devices or for verification of previously established communication parameters for the devices under test. Such verification may be made at a next step 214 at which previously established communication parameters are compared to values identified at the step 212. If any values do not correlate at the step 214, the routine may determine at a next step 216 that an incorrect adapter is present in the system, for example if the communication parameters that did not correlate were initially established through the analysis of the adapter circuitry at the described step 204. If an incorrect adapter is determined to be present, the routine moves from the step 216 to notify the tool operator of such incorrect adapter at a step 218, such as by prompting the operator using any conventional display device that may be included with the diagnostic tool, and then by delaying for a short period at a step 220 to allow the operator to take note of the incompatibility and to correct it, and then the routine returns to the step 204 and repeats steps 204–216 to again establish communications and verify that the correct adapter is in place.

Returning to the step 216, upon determining that the correct adapter is in place, the controller 78 outputs select signals via its QSPI unit 76 to SIPO 72 for application to analog switches 68 and 88 at a next step 222, so that output communication pull-up values may be applied to outgoing communication signals that are compatible with the communications protocol of the electronic devices to which they will be passed, and so that comparators, such as COMP 54, may decode input communications at the appropriate voltage reference thresholds, as described. The select signals may be predetermined as the signals needed to pass the appropriate voltage levels through each of the analog switches to allow for corresponding voltage levels to be applied to communications signals, as was described for the hardware of FIG. 1.

Figure 3:
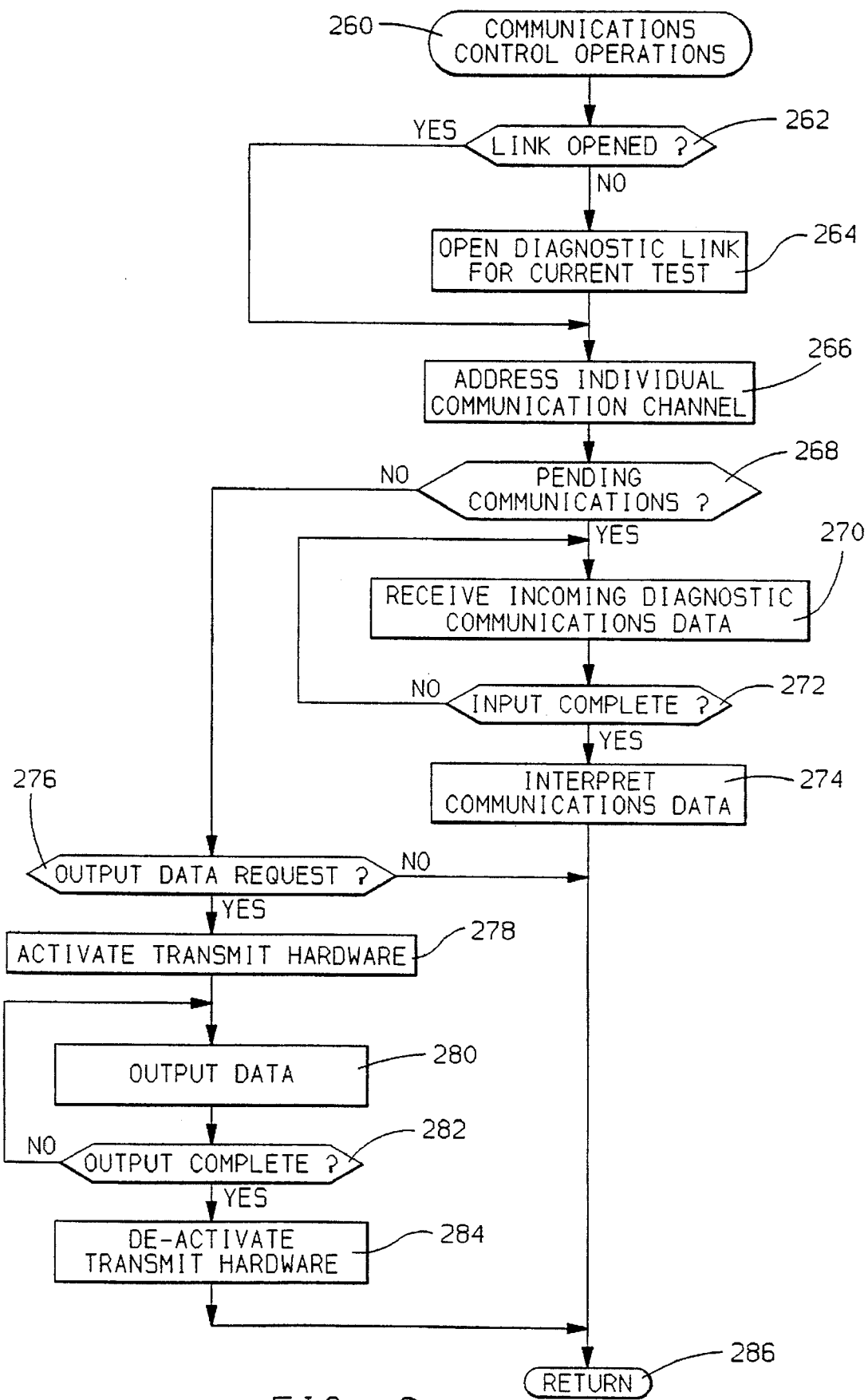

The operator is next prompted to begin the diagnostic test at a step 224, such as by indicating that the diagnostic tool is ready for testing on any display that may be included with the diagnostic tool. Communications control operations are then executed at a step 226, during which operations the control described for the hardware of FIG. 1 is provided in response to operator-requested interactions with various of the automotive electronic devices, wherein control commands are issued by controller 78 for each of various electronic devices, the commands are passed through to the appropriate encoding hardware of FIG. 1 to translate the commands to the applicable communications protocol used by the electronic device to receive the commands, and the translated commands are output to the electronic devices. Response information from the devices is received and decoded through the hardware of FIG. 1, and is passed to controller 78 in a form usable by controller for diagnosing the devices. The specific controller operations for carrying out such bi-directional or, in the case of two wire serial communications, unidirectional diagnostic communications are illustrated in FIG. 3, the operations of which are initiated upon execution of the program call at the step 226 of FIG. 2. Such operations, to be more fully described, continue on until the operator's diagnostic operations are complete, such as may be indicated by a manual indication of a completed test by the diagnostic tool operator. When the operations are complete, as determined at a next step 228, the communications configuration is reset at a next step 230 wherein the hardware reserved for use during the diagnostic test is reset so as to be available for other communications operations. In this manner, the general hardware of FIG. 1 may be repeatedly reconfigured to accommodate the protocol required for a wide variety of automotive vehicle diagnostic communications tasks, not limited to an individual vehicle make, model, model year or manufacturer. Further, the reconfiguration may be automated through the hardware of FIG. 1, wherein the operator simply requests the function desired to be communicated and the hardware of FIG. 1 is reconfigured by the controller 78 without further operator intervention to establish the required communications channels. The reset operations of the step 230 may include resetting the XPT 64, clearing lists of hardware components that were reserved for use during the completed test, deactivating any of such hardware components, disabling any conventional communications interrupts used to carry out the diagnostic communications, and resetting analog switches, such as switches 88 and 96 to remove pull-ups from the communication channels. The test routine then ends at a step 232 to await a later startup at the beginning of a next diagnostic test.

Referring to FIG. 3, the series of operations used to provided bi-directional or uni-directional diagnostic communications between the diagnostic tool of this invention and at least one automotive electronic device are illustrated, and are initiated upon execution of the step 226 of FIG. 2, starting at a step 260 and proceeding to a step 262 to determine if a diagnostic link including one or more individual communication channels has been opened for the current diagnostic test. The diagnostic link will, in this embodiment, be opened upon the first execution of the routine of FIG. 3 at the start of a diagnostic test, such as when a new analysis of operation of at least one electronic device on the vehicle is desired.

If the diagnostic link is not determined to be opened at the step 262, it is opened at the step 264, by determining and reserving, if possible, the communications hardware needed to carry out the desired diagnostic test. The needed hardware is determined by referencing the protocol of the vehicle electronic device or devices that are to be communicated with during the test, establishing the encoding and decoding hardware from the general schematic of FIG. 1 needed to encoded and decode control messages into and out of such protocol, and the drivers, analog switches, pull-up resistors and other components needed to access such encoding and decoding hardware. The determined hardware is reserved by first establishing that none of such hardware has already been reserved to carry out another communication task and by storing a list of the hardware in controller memory, such as conventional controller random access memory. In this embodiment, any communication task that requires use of communication hardware components of FIG. 1 should store a list of such hardware components in controller memory as an indication that such hardware is temporarily not available for other communication tasks. Interruption of established communications may thereby be avoided. The diagnostic link opened at the step 264 may include more than one communication channel. For example, if the current diagnostic test requires communication with more than one vehicle electronic device, more than one communication channel will be required to be opened to provide for communication with the multiple devices. All hardware needed to support communications with the required communication channels should be reserved at the step 264.

After opening the diagnostic link, or if the link was determined at the step 262 to already be open, an individual communication channel selected from the channels making up the open diagnostic link is addressed at a next step 266. The addressed channel is the channel on which current diagnostic communications are required. Such channel is addressed by referencing from controller memory the list of communications components that were established as available and are needed for communication across the active channel. The referenced components may also be configured, if necessary, to establish the communication channel, such as by configuring the cross point switch 64 (FIG. 1) to pass information properly between components, to configure the analog switches 68, 88, and 96 as necessary to pass information back and forth across the active channel, etc.

After addressing the active communication channel at the step 266, a determination is made as to whether any pending communications are present on the active communications channel. Such pending communications are incoming from the electronic device interfaced by the active channel but not yet fully decoded or interpreted by the communications hardware of FIG. 1. If such communications are pending at the step 268, the communications are received at a next step 270, by activating the decode hardware of FIG. 1 for the active communications channel to carry out any conventional receive, decode, and data transfer operations needed to decode and pass the received information through to the controller 78 of FIG. 1. For example, if the UART 62 of FIG. 1 is to be used for the current communications, the XPT 64 may be configured to receive decoded communications information from the Rx input of the UART and to pass such communications through to the TPU 80 or directly to the controller 78 for interpretation. If, by way of further example, a dedicated interface circuit from the plurality of such circuits 94 (FIG. 1) is to support the current communications, the XPT 64 may be configured to pass incoming communications through to the appropriate interface circuit and such circuit operated in accord with conventional practice to decode and output the communications to either the XPT 64 for passage to the TPU 80 or directly to the controller 78, such as through its QSPI unit.

Such input operations continue until a complete message is received by repeatedly executing the step 270 and the step 272. When the incoming message is complete as determined at the step 272, the message may be interpreted in accord with conventional diagnostic practices generally known to those of ordinary skill in the art at a step 274. Following the interpretation that may occur at the step 274, the routine of FIG. 3 returns to the step 226 of FIG. 2 from which it was called, via a return step 286.

Returning to the step 268, if there are no pending communications in the current active communication channel (the individual channel addressed at the step 266), an output data request is analyzed at a next step 276. An output data request is present when controller 78 is prepared to output a diagnostic message to the vehicle electronic device associated with the current active communication channel. Such diagnostic message may request temporary re-positioning of an actuator controlled by the electronic device, such as a vehicle torque converter clutch, air conditioning compressor clutch, EGR valve, etc., or may request adjustment of engine control parameters, such as air/fuel ratio block learn or closed-loop correction values, or may request present value information of stored device parameters. The diagnostic message is used to analyze performance of the electronic device or the systems or functions controlled thereby in accord with conventional vehicle diagnostics. If a request to send out such a message is determined to be present at the step 276, steps 278–282 are executed to output the message across the current active communication channel. Specifically, any transmit hardware needed to output the message is activated at a step 278, such as by priming transmit hardware to begin serial transmission of the message that may be made available on a controller output line. Hardware activation at the step 278 should conform to generally available manufacturer specifications relating preparation of the hardware for serial communications, as is generally understood in the art. After activating the hardware, data is output in serial form at a step 280, such as by transferring the message information to the device used to encode the information and send it out in serial form.

For example, if the UART 62 is to output the message, it is activated if necessary at the step 278, and information is transferred directly to it from the controller 78, and the XPT 64 configured (by controller 78) to receive the UART transmit line Tx output signal on line 102 and pass the received information through to a line driver from the set of drivers 86 which outputs the serial information to the output line 92 pulled up to a voltage established through the selected configuration of analog switch 88. If, by way of further example, the outgoing message is to be encoded by a dedicated interface circuit from the set of such circuits 94, controller 78 may, via its QSPI 76, pass the information directly to the interface circuit for encoding, and the circuit pass the encoded message out via analog switch 96 as configured by controller 78 via SIPO 72. As an additional example, the versatile circuitry of FIG. 1 in accord with this embodiment supports direct controller interaction with an electronic device through, for example, the TPU 80, wherein the message may be output in a timed manner by the TPU 80 via output line 84 to buffer 98 for buffered communications with the electronic device.

Returning to the step 280, the output data step 280 is repeated via execution of a next step 282 until the entire message has been encoded and passed to output stages of the circuitry of FIG. 1. After the message is determined to be completely output at the step 284, or if no output data request was determined to be present at the step 276, the routine returns to the routine of FIG. 2 via the described step 286. After returning to the step 286, a check is made as to whether the current test is complete, wherein the reserved hardware is no longer needed for diagnostic communications. If the test is complete, the reserved hardware (reserved at the step 264 of FIG. 3) is reset so that it is no longer dedicated to the completed test, but rather is made available for use by any subsequent diagnostic or other communication task. In this manner, while certain hardware may be temporarily sequestered for use in a specific diagnostic communication task, it is made available immediately after the task is complete to allow for flexibility in use for a wide range of communication applications in accord with an advantage of this invention.

The preferred embodiment for the purpose of explaining this invention is not to be taken as limiting or restricting this invention since many modifications may be made through the exercise of skill in the art without departing from the scope of this invention.

The embodiments of the invention in which a property or privilege is claimed are described as follows:

1. A method of diagnosing automotive vehicle electronic devices in which a diagnostic tool supports diagnostic communications under a predetermined plurality of diagnostic communication protocols, comprising the steps of:

interfacing the diagnostic tool with an automotive vehicle having a plurality of electronic devices;

indicating when diagnostic communications with at least one of the plurality of electronic devices is to be provided;

determining the communication protocols under which at least one of the plurality of electronic devices communicates; and providing diagnostic communications with at least one of the plurality of electronic devices under the determined communication protocols.

2. The method of claim 1, further comprising the steps of:

reserving diagnostic tool hardware for communicating under the determined communication protocols; and activating the reserved diagnostic tool hardware;

and wherein the providing step provides diagnostic communications with at least one of the plurality of electronic devices via the activated reserved diagnostic tool hardware.

3. The method of claim 2, further comprising the steps of:

detecting when diagnostic communications with at least one of the plurality of electronic devices are complete; and de-activating the reserved diagnostic tool hardware upon detecting when the diagnostic communications are complete.

4. The method of claim 2, further comprising the steps of:

indicating when additional diagnostic communications with additional electronic devices is to be provided;

determining the additional communication protocols under which the additional electronic devices communicate;

referencing the diagnostic tool hardware required for diagnostic communications under the determined additional communication protocols; and if the referenced diagnostic tool hardware has not been reserved, then providing diagnostic communications with the additional electronic devices via the referenced diagnostic tool hardware.

5. The method of claim 1, wherein each of the automotive vehicle electronic devices communicates via a serial communication channel and the diagnostic tool receives diagnostic communications via a diagnostic communications connector, the interfacing step further comprising the steps of:

providing a communications connection between the serial communications channel of each of the plurality of electronic devices and the diagnostic communications connector; and receiving information identifying the automotive vehicle and the plurality of electronic devices upon providing the communications connection.

6. The method of claim 1, further comprising the steps of:

determining diagnostic tool encoding hardware for encoding diagnostic communications into the determined communication protocols;

determining diagnostic tool decoding hardware for decoding diagnostic communications from the determined communication protocols; and activating the determined diagnostic tool encoding and decoding hardware.

7. The method of claim 6, further comprising the steps of:

when diagnostic communications are to be output to an electronic device included within at least one of the plurality of electronic devices, applying the diagnostic communications that are to be output to the activated encoding hardware corresponding to the electronic device to encode the communications into the corresponding communications protocol; and transmitting the encoded communications to the electronic device.

8. The method of claim 6, further comprising the steps of:

when diagnostic communications are to be input from an electronic device included within at least one of the plurality of electronic devices, receiving the diagnostic communications from the electronic device; and applying the received diagnostic communications to activated decoding hardware corresponding to the electronic device to decode the communications from the corresponding communications protocol.

9. A diagnostic method for providing diagnostic communications between a diagnostic tool and automotive vehicle electronic devices under a predetermined plurality of diagnostic communication protocols, comprising the steps of:

providing input signal information to the diagnostic tool identifying the electronic devices to be diagnosed;

identifying when diagnostic communications with one of the identified electronic devices is to occur;

referencing a diagnostic communications protocol under which the one of the identified electronic devices transmits and receives diagnostic communications;

identifying diagnostic tool hardware for communicating under the referenced diagnostic communications protocol; and activating the identified diagnostic tool hardware to provide for diagnostic communications with the one of the identified electronic devices.

10. The method of claim 9, further comprising the steps of:

determining when diagnostic communications with the one of the identified electronic devices is complete; and de-activating the identified diagnostic tool hardware upon determining that the diagnostic communications are complete.

11. The method of claim 9, further comprising the steps of:

while the identified diagnostic tool hardware is activated, determining when diagnostic communications with an additional one of the identified electronic devices is to occur;

referencing an additional diagnostic communications protocol under which the additional one of the identified electronic devices transmits and receives diagnostic communications;

identifying the additional diagnostic tool hardware for communicating under the additional diagnostic communications protocol;

determining if the identified additional diagnostic tool hardware is activated; and if the identified additional diagnostic tool hardware is not activated, then activating the identified additional diagnostic tool hardware to provide for diagnostic communications with the additional one of the identified electronic devices.

12. The method of claim 11, further comprising the steps of:

if the identified additional diagnostic tool hardware is activated, then sensing de-activation of the identified additional diagnostic tool hardware; and upon sensing the de-activation, reactivating the identified additional diagnostic tool hardware to provide for diagnostic communications with the additional one of the identified electronic devices.

* * * * *